United States Patent
Granig et al.

(10) Patent No.: US 11,500,038 B2
(45) Date of Patent: Nov. 15, 2022

(54) SENSOR, CONTROL DEVICE AND METHOD FOR DETERMINING THE DIRECTION OF A MAGNETIC FIELD

(71) Applicant: Infineon Technologies AG, Neubiberg (DE)

(72) Inventors: Wolfgang Granig, Seeboden (AT); Manuel Gillinger, Feldkirchen (AT)

(73) Assignee: Infineon Technologies AG, Neubiberg (DE)

( * ) Notice: Subject to any disclaimer, the term of this patent is extended or adjusted under 35 U.S.C. 154(b) by 5 days.

(21) Appl. No.: 17/248,331

(22) Filed: Jan. 20, 2021

(65) Prior Publication Data
US 2021/0223334 A1 Jul. 22, 2021

(30) Foreign Application Priority Data
Jan. 21, 2020 (DE) .......................... 102020101363.9

(51) Int. Cl.
*G01R 33/00* (2006.01)
*G01R 33/09* (2006.01)
(52) U.S. Cl.
CPC ......... *G01R 33/0017* (2013.01); *G01R 33/09* (2013.01)
(58) Field of Classification Search
CPC ......... G01R 33/09; G01D 3/036; G01D 5/145
See application file for complete search history.

(56) References Cited

U.S. PATENT DOCUMENTS

| | | | | |
|---|---|---|---|---|
| 6,448,761 B1* | 9/2002 | Stumpe | ................ | G01D 5/145 324/207.2 |
| 9,475,520 B2* | 10/2016 | Yanai | ...................... | G01B 7/31 |
| 2005/0001613 A1* | 1/2005 | Blossfeld | ............... | G01D 5/147 324/251 |
| 2007/0200564 A1* | 8/2007 | Motz | ...................... | G01R 33/09 324/252 |
| 2008/0033664 A1* | 2/2008 | Yamanoto | .............. | G01B 5/285 702/36 |
| 2009/0315541 A1* | 12/2009 | Zak | ..................... | G01R 33/0094 324/207.2 |
| 2010/0321008 A1* | 12/2010 | Mita | ....................... | G01D 5/145 324/207.25 |
| 2018/0178384 A1* | 6/2018 | Kawase | ..................... | B25J 9/06 |

FOREIGN PATENT DOCUMENTS

| | | |
|---|---|---|
| DE | 102004017191 A1 | 10/2005 |
| DE | 102016118384 A1 | 3/2018 |
| EP | 1256778 A1 | 11/2002 |
| EP | 2244070 A1 | 10/2010 |

* cited by examiner

*Primary Examiner* — Alvaro E Fortich
(74) *Attorney, Agent, or Firm* — Harrity & Harrity, LLP (57) ABSTRACT

An example of a sensor for determining a direction of a magnetic field comprises at least one magnetoresistive sensor element for determining the direction of the magnetic field, and at least one further sensor element of another type which is suitable for determining the direction of the magnetic field.

20 Claims, 8 Drawing Sheets

SENSOR, CONTROL DEVICE AND METHOD FOR DETERMINING THE DIRECTION OF A MAGNETIC FIELD

CROSS REFERENCE TO RELATED APPLICATION

This application claims priority to German Patent Application No. 102020101363.9 filed on Jan. 21, 2020, the content of which is incorporated by reference herein in its entirety.

TECHNICAL FIELD

Exemplary implementations deal with sensors and control devices for determining a direction of a magnetic field.

BACKGROUND

Sensors and their control devices for determining a direction of a magnetic field are used, for example, to determine the position of a rotating shaft, to the end of which a magnet is fitted. The magnet, for example a rod magnet, generates a bipolar magnetic field. The sensors consequently use the direction of the magnetic field to measure a position of the shaft, that is to say the instantaneous angle of rotation, if a rotating shaft is involved. For a shaft of an electric motor, this measurement variable is used, inter alia, to control the electric motor. Such electric motors are used in electrified drives, for example. Magnetoresistive sensors (XMR sensors) which generate a high-amplitude output signal are often used to measure the magnetic field. These are typically already operated in saturation at low field strengths and their measured values are not very noisy.

With increasing precision of the control of electric motors, the demands imposed on the maximum permitted angle error when determining the rotational angle are becoming increasingly higher, with the result that even XMR sensors calibrated during production can possibly no longer meet these demands forever. The calibrated parameters of the sensor elements can change greatly during the service life of the sensor or in the case of varying environmental conditions such that, on account of this, they can possibly no longer meet the demand imposed on the maximum permitted angle error over the course of the service life. Although it is possible, in principle, for example for an arrangement of magnetoresistive sensor elements which are respectively sensitive to mutually orthogonal components of a magnetic field, to track amplitude changes and changing offsets as well as a deterioration in the orthogonality of the two measured magnetic field components during operation and to continuously correct them, this is not possible, in principle, for the phase of the measured magnetic field direction. The phase corresponds to the reference direction, with respect to which the angle is determined using the sensor elements, with the result that an error in the phase inevitably results in an incorrect measured value for the angle.

SUMMARY

The application describes improved sensors and measurements for determining a direction of a magnetic field.

Exemplary implementations of a sensor for determining a direction of a magnetic field comprise at least one magnetoresistive sensor element for determining the direction of the magnetic field, and at least one further sensor element of another type which is suitable for determining the direction of the magnetic field. Whereas the magnetoresistive sensor element can be used to reliably determine the direction of the magnetic field with a single measurement, the further sensor element of such a sensor can make it possible to determine a slowly changing phase error or a slowly changing reference direction of the magnetoresistive sensor element. This makes it possible to accordingly correct the direction of the magnetic field determined using the magnetoresistive sensor element.

One example implementation of a control device for determining a direction of a magnetic field is designed to determine a first angle indicating the direction of the magnetic field on the basis of measured values from a magnetoresistive sensor element. The control device is also designed to correct the first angle on the basis of measured values from a further sensor element of a different type which is suitable for determining the direction of the magnetic field. Such a control device can be used to compensate for phase errors of the measured values from the magnetoresistive sensor element which would otherwise result in errors in a calculated angle, which indicates the direction of the magnetic field, during operation.

According to one example implementation of a method for determining a direction of a magnetic field, a first angle indicating the direction of the magnetic field is accordingly determined using at least one magnetoresistive sensor element. Furthermore, the first angle is corrected on the basis of measured values from a further sensor element of a different type which is suitable for determining the direction of the magnetic field in order to obtain, as a result, measured values with long-term stability for the first angle which have only a small error.

BRIEF DESCRIPTION OF THE FIGURES

Some examples of apparatuses and/or methods are explained in more detail merely by way of example below with reference to the accompanying figures, in which:

FIG. 6 (shown as including FIGS. 6A and 6B) shows examples of the accuracy of the determination of a phase value when using an example implementation of a control device;

DESCRIPTION

Various examples are now described in more detail with reference to the accompanying figures. However, this detailed description does not restrict further examples to the implementations described in detail. Further examples may cover modifications, equivalents and alternatives which fall within the scope of the disclosure. The terminology used here to describe particular examples is not intended to be restrictive for further examples.

In the entire description of the figures, identical or similar reference signs relate to identical or similar elements which may be implemented in an identical manner or in a modified form when compared with one another, while providing the same or a similar function. In the figures, the thicknesses of lines, layers and/or regions may be exaggerated for illustration.

If two elements A and B are combined using an "or", this should be understood as meaning that all possible combinations are disclosed, that is to say only A, only B and A and B, unless explicitly or implicitly defined otherwise. An alternative formulation for the same combinations is "at least one of A and B" or "A and/or B". The same applies to combinations of more than two elements.

If a singular form, for example "a, an" and "the", is used and the use of only a single element is neither explicitly nor implicitly defined as obligatory, further examples may also use a plurality of elements to implement the same function. If a function is described below as being implemented using a plurality of elements, further examples may implement the same function using a single element or a single processing entity. It also goes without saying that the terms "comprises", "comprising", "has" and/or "having" in use specify the presence of the stated features, integers, steps, operations, processes, elements, components and/or a group thereof, but do not exclude the presence or addition of one or more other features, integers, steps, operations, processes, elements, components and/or a group thereof.

Figure 1:
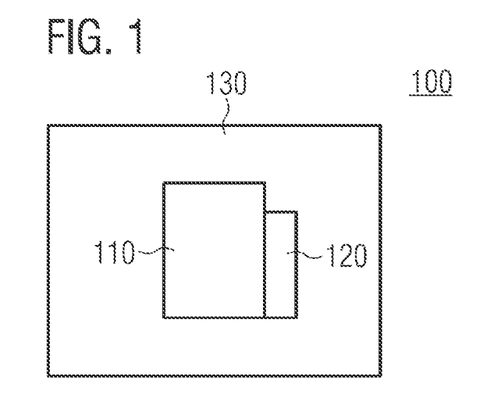
FIG. 1 schematically shows an example implementation of a sensor.

FIG. 1 schematically shows an example implementation of a sensor 100. The sensor 100 has a magnetoresistive sensor element 110 for determining the direction of the magnetic field. A magnetoresistive sensor element 110 or an XMR sensor element has a variable electrical resistance which depends on a relative orientation between an external magnetic field and a preferred direction impressed on the sensor element. Whereas the maximum change in resistance may be different in different magnetoresistive sensor elements, for example AMR (anisotropic magnetoresistive effect), GMR (giant magnetoresistance) or TMR (tunnel magnetoresistance) elements, considered in absolute orders of magnitude, it is typically large enough to obtain a low-noise measurement signal. A relative orientation between the preferred direction of the magnetoresistive sensor element and the direction of the magnetic field, which has a low statistical error, can therefore be determined from a single measurement signal. This relative orientation is typically stated as an angle.

Even though an offset of the measured values and a temporally changing maximum amplitude can be corrected from a plurality of measured values each corresponding to different relative orientations between the magnetic field and the preferred direction of a magnetoresistive sensor element, this is not possible for a changing preferred direction. However, the latter can change slowly on account of aging, temperature differences or other effects, for example, in XMR sensors with an impressed preferred direction. The preferred direction may correspond, for example, to the direction of a fixed magnetization of one or more layers in the sensor, and a change in the preferred direction may be caused, for example, by changing ambient temperatures which result in increased thermal excitation of the spin directions. On account of the fact that the measured value from a magnetoresistive sensor element has a sinusoidal or cosinusoidal profile during a complete 360° rotation between the preferred direction and the direction of the magnetic field, an error in the preferred direction is also referred to as a phase error since the phase of the sine or cosine changes as a result. This error inevitably results in an incorrect angle if the latter is intended to relate to a fixed coordinate system, as is conventional.

The further sensor element 120 of another type likewise makes it possible to determine the direction of the magnetic field and therefore provides a further measured value for the relative direction between the magnetic field and the further sensor element. As explained in more detail in the following examples, this further measured value can be used to compensate for a phase error of the magnetoresistive sensor element or an error resulting therefrom in the determination of the direction or the angle of the magnetic field. A sensor element of another type can be understood as meaning the fact that the further sensor element generates the measured value on the basis of a different physical mechanism than the magnetoresistive sensor element used in the specific example.

For example, for the further sensor element, it is possible to use a sensor element with a measurement principle having an intrinsic phase stability. This is possible even when the individual measured values from such a further sensor element are so noisy that the relative orientation between the magnetic field and the further sensor element cannot be determined with a suitable accuracy using a single measurement.

According to some example implementations, a Hall sensor element, which intrinsically has an extremely high phase stability, is therefore used as the further sensor element. The measured values from a Hall sensor element are often noisy since the Hall voltage which can be measured is comparatively low. However, the Hall effect is not dependent on a relative orientation between a direction impressed into the Hall sensor (such a direction does not exist in the Hall sensor element) and the direction of the magnetic field. Therefore, the above-described long-term changes (drift) in the phase of the measured value from the Hall sensor element do not occur in principle and this sensor element is therefore highly suitable for correcting a phase error of a magnetoresistive sensor element on account of its intrinsic properties.

According to some example implementations, the magnetoresistive sensor elements 110 of the sensor 100 are arranged on a surface of a substrate 130. In the case of such an arrangement, the use of a Hall sensor element may have the advantage that it can be arranged inside the substrate 130 itself. Hall sensor elements do not require any special doping profiles or other additional process steps and can therefore be integrated in an established process for producing a sensor which can also contain, for example, inside the substrate 130, signal processing circuits for evaluating the measured values from the magnetoresistive sensor element. Since the magnetic field acts on the charge carriers inside the Hall sensor element in the case of the Hall effect, the further sensor element extends inside the substrate in a direction perpendicular to the surface of the substrate 130 according to some example implementations if the magnetic field direction parallel to the surface of the substrate 130 is intended to be determined using the magnetoresistive sensor element. In this case, the exact position of the Hall sensor elements relative to the magnetoresistive sensor elements 110 can be freely selected in principle. For example, in a plan view of the surface of the substrate, the Hall sensor element can be arranged beside or below the magnetoresistive sensor element 110.

The use of a conventional semiconductor patterning process, for example the CMOS process, to produce both the magnetoresistive sensor element 110 and the Hall sensor element inside or on the substrate 130 may also result in the relative orientation or angular position between the magnetoresistive sensor element 110 and the Hall sensor element being extremely high in a manner following the conventional high process accuracies.

Figure 2:
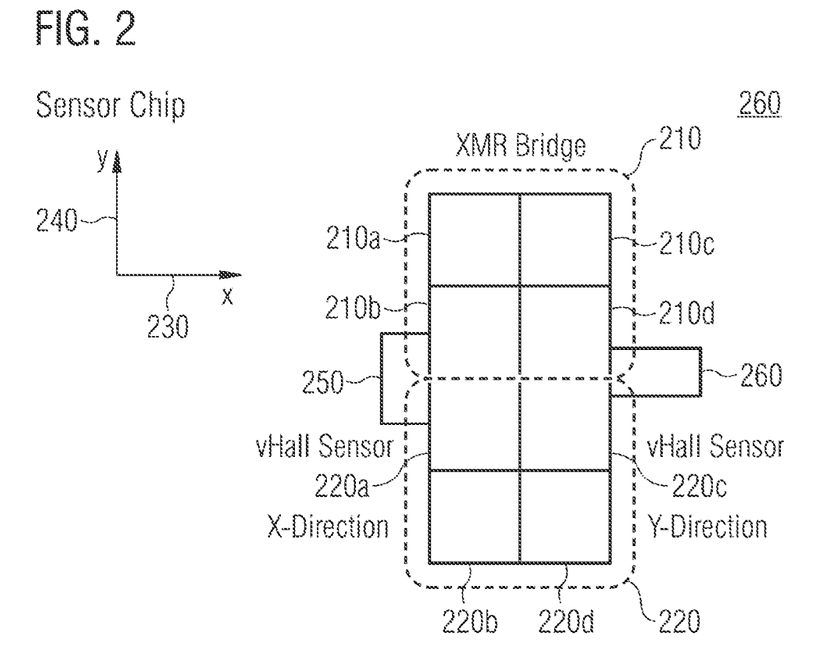
FIG. 2 schematically shows an example implementation of a sensor having two measurement bridges comprising magnetoresistive sensor elements and having two further sensor elements.
Figure 3:
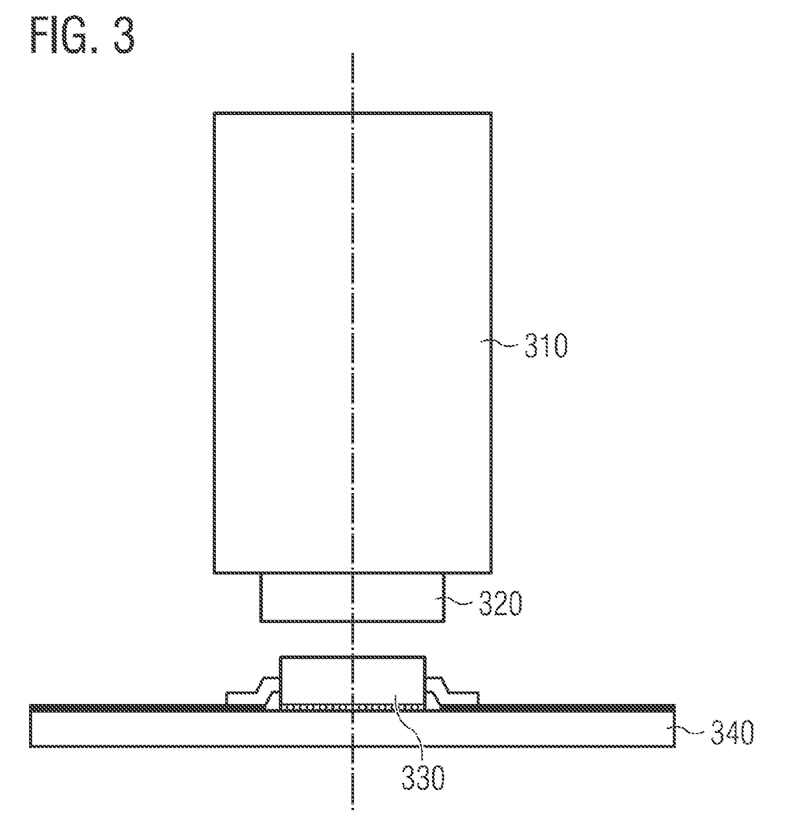
FIG. 3 shows an example of an arrangement of a sensor for determining an angle of a rotating shaft.
Figure 4:
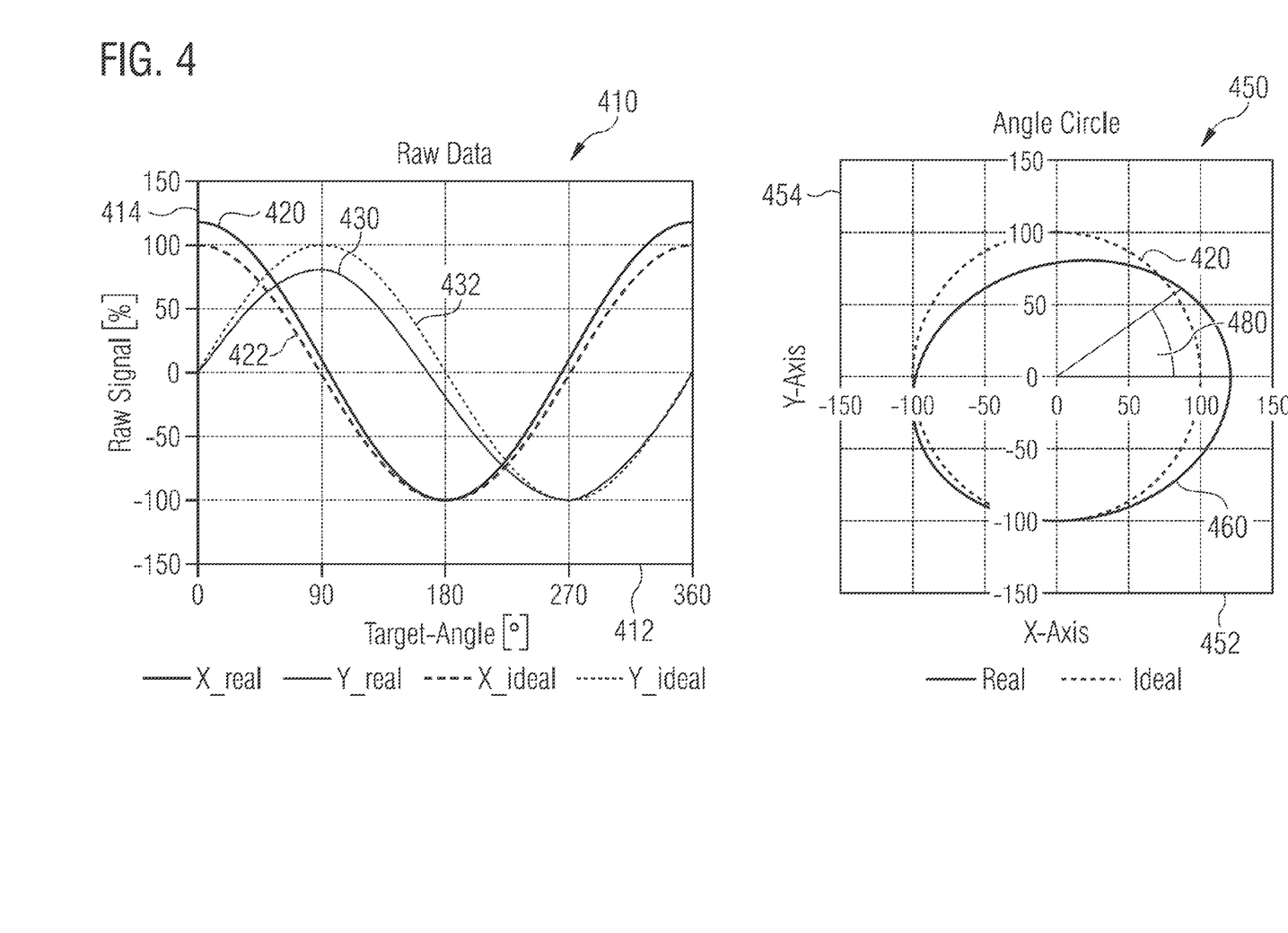
FIG. 4 shows an example of the measured values from the two measurement bridges of the sensor from FIG. 2 during a complete rotation of the measured magnetic field.

Whereas FIG. 1 shows a schematic illustration of the basic structure of a sensor 100 which makes it possible to correct the phase of a magnetoresistive sensor element, FIGS. 2-4 illustrate an example implementation of a sensor which is used in practice.

The sensor 200 shown in FIG. 2 has a first full-bridge circuit 210 comprising four magnetoresistive sensor elements 210a to 210d which are connected to one another in a bridge circuit and determine the component of the magnetic field in an X direction 230. The sensor 200 also has a second full-bridge circuit 220 comprising four magnetoresistive sensor elements 220a to 220d which are connected to one another in a bridge circuit and determine the component of the magnetic field in a Y direction 240 orthogonal thereto. A first Hall sensor element 250 is arranged in such a manner that it is suitable for determining the component or direction of the magnetic field in the X direction. A second Hall sensor element 260 is arranged in such a manner that it is suitable for determining the direction of the magnetic field in the Y direction 240. For this purpose, the Hall sensor elements are connected in such a manner that their current direction respectively runs perpendicular to the magnetic field components to be measured.

The sensor illustrated in FIG. 2 can be used to measure the direction of a magnetic field in the X-Y coordinate system using the evaluation of the measured values from the two measurement full-bridge circuits 210 and 220 which is described below. Phase errors in the measured values from the magnetoresistive sensor elements can be compensated for using the measured values from the Hall sensor elements 250 and 260.

The expected measured values for a practical application for determining the direction of a rotating shaft, which is illustrated in FIG. 3, are illustrated in FIG. 4.

In the measurement arrangement for determining a rotational angle of a rotating shaft 310, as shown in FIG. 3, a magnet 320 is fitted to an axial end of the shaft 310 and generates a directed magnetic field, for example a dipole field. The direction of the magnetic field generated by the magnet 320 is determined using an example implementation of a sensor 330 which, in the present case, is inside a chip housing and with which contact is made using a PCB (Printed Circuit Board).

The sensor has the arrangement of magnetoresistive sensor elements and Hall sensor elements which is illustrated in FIG. 2. A rotational angle which indicates the angle of the shaft 310 with respect to an initially defined direction is determined using the combined evaluation of the measured values provided by the first full-bridge circuit 210 and the second full-bridge circuit 220. The ideal error-free measured values and examples of erroneous measured values are shown in FIG. 4.

In the left-hand image 410 in FIG. 4, the rotational angle of the shaft 310 is plotted on the x axis 412 and the measured values 420, 422 from the first bridge circuit 210 which measures the X component of the magnetic field are plotted on the Y axis 414. The measured values 430 and 432 from the second bridge circuit 220 which measures the Y component of the magnetic field are also illustrated. In this case, the curves corresponding to measure values 422 and 432 each show the idealized, error-free measured values and the curves corresponding to measured values 420 and 430 show erroneous measured values which respectively have an amplitude error, an offset and a phase error.

Since the measured values from the two bridge circuits represent the X component and the Y component of the magnetic field, the direction of the field can be determined by combining the two measured values. With suitable normalization of the measured values, the ideal angle circle 470 shown in the right-hand image 450 results if the measured values are error-free. In the image 450, the normalized measured value for the X component of the magnetic field is plotted on the X axis 452 and the normalized measured value for the Y component of the magnetic field is plotted on the Y axis 454. The right-hand image 450 illustrates how a position on the angle circle, which in turn defines the first angle 480 determined using the magnetoresistive sensor elements, is unambiguously determined by combining the measured values. In the real, erroneous case which is illustrated by the elliptically deformed angle circle 460, errors arise in the angle determination and can result in the accuracy suitable for the angle determination not being able to be achieved.

Even though the amplitude errors and the offsets of the measured values 420 and 430 can be compensated for by evaluating a plurality of measured values during a complete rotation in the measured values 420 and 430 and it may also be possible to identify a relative phase shift between the measured values 420 and 430, it is not possible to determine an absolute phase error of the measured values on the basis of the measured values from the magnetoresistive sensor elements themselves.

Exemplary implementations make this possible by using further sensor elements which can be used to determine the direction of the magnetic field. Although Hall sensors are used for this purpose in the specifically described example implementations, any other desired types of sensor elements which can determine the direction of a magnetic field can also be used.

Figure 5:
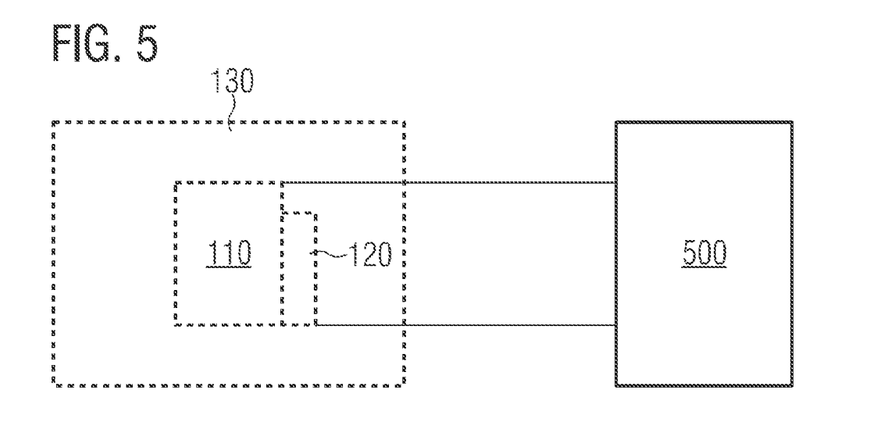
FIG. 5 schematically shows an example implementation of a control device for determining a direction of a magnetic field on the basis of measured values from a sensor.

The first angle 480 can be corrected, for example, inside a control device 500 for determining the direction of a magnetic field, which control device is schematically illustrated in FIG. 5. This control device evaluates the measured values from at least one magnetoresistive sensor element 110 and from at least one further sensor element 120. Such a method for determining the direction of the magnetic field can be carried out on a control device or on hardware which is inside a housing of the sensor or on other computing units which are outside the housing of the sensor. Examples of these are electronic control devices for controlling electric motors which typically have a higher computing power than the electronic components inside a sensor which are often used only to determine the angle 480 from the measured voltages or measured values using simple mathematical operations and to output this angle as a measured value.

As shown in FIG. 4, the angle 480 ($\hat{\alpha}$) is determined by combining the measured values Y for the Y component (measure value 430), which is also referred to as the sine component, with the measured values X for the X component (measure value 420), which is also referred to as the cosine component, using the arc tangent function:

$$\hat{\alpha} = \tan^{-1} \frac{Y}{X}. \qquad 5$$

In some applications, use is made of an implementation of the arc tangent function which expands the definition range of the function from +/−90° to +/−180°.

$$\hat{\alpha} = \operatorname{atan} 2(X,Y).$$

Real systems have the errors in the signal amplitude A, the phase φ and offsets O illustrated in FIG. 4, thus resulting in the actual measured values as follows:

$$X = A_X \cdot \cos(\alpha + \varphi_X) + O_X$$

$$Y = A_Y \cdot \cos(\alpha + \varphi_Y) + O_Y.$$

These can be corrected in different ways using the measured values from a further sensor element using an example implementation of the control device 500 schematically shown in FIG. 5 or an example implementation of the method used therein.

Different methods of how the first angle 480 ($\hat{\alpha}$) can be corrected inside the control device 500 are described below for the set-up which is shown in FIG. 2 and uses a Hall sensor element as the further sensor element.

On account of the measurement principle, Hall sensors have phase accuracy even though measured values from Hall sensors may have a comparatively large offset and small signal amplitudes. Only for the sake of completeness, it shall also be noted that, if Hall sensor elements have a phase drift (change in the phase on a long time scale) which is caused by voltages in the substrate of the Hall sensor element, this phase drift would occur in an equivalent manner in the X and Y directions in the arrangement shown, with the result that it could be corrected as follows by combining the two phases $\varphi_{HX}$ and $\varphi_{HY}$:

$$\varphi_{HX\_corr} = \varphi_{HX} + (\varphi_{HY} - \varphi_{HX})/2.$$

Since this effect which can be corrected in principle is irrelevant to understanding the correction of the first angle 480, measured values from the Hall sensor elements which do not have such a phase drift are assumed below.

A first possible way of correcting the first angle 480, that is to say the direction of the magnetic field determined using the magnetoresistive sensor elements, involves first of all determining, from the measured values from the Hall sensor elements, a phase value which defines the rotation of the shaft 310 with respect to the defined coordinate system and using this as a reference for correcting the first angle 480. According to this method of correcting the first angle 480, a phase value is consequently first of all determined on the basis of the measured values from the further sensor element or the Hall sensor element in order to correct the first angle 480.

One possible way of determining the phase value on the basis of the measured values from the Hall sensor elements involves determining absolute phase values on the basis of a plurality of measured values, which are recorded at constant angle increments during a complete revolution of the shaft 310, using a discrete Fourier transform (DFT) or a fast Fourier transform (FFT) for the X component and the Y component as follows and then using them to correct the phases of the measured values from the electrorestrictive sensor elements. The absolute phase values are determined as follows.

$$HY_{re} = \sum_{i=1}^{n} \cos(\alpha_{XMR}(i)) \cdot HY(\alpha_{XMR}(i))$$

$$HY_{im} = \sum_{i=1}^{n} \sin(\alpha_{XMR}(i)) \cdot HY(\alpha_{XMR}(i))$$

$$HX_{re} = \sum_{i=1}^{n} \cos(\alpha_{XMR}(i)) \cdot HX(\alpha_{XMR}(i))$$

$$HX_{im} = \sum_{i=1}^{n} \sin(\alpha_{XMR}(i)) \cdot HX(\alpha_{XMR}(i))$$

$$\varphi_{HY} = \operatorname{atan2}(HY_{re}, HY_{im})$$

$$\varphi_{HX} = \operatorname{atan2}(HX_{re}, HX_{im})$$

The recording of the measured values at constant angle increments can be carried out, for example, during a calibration procedure in which the shaft 310 or an electric motor connected to the latter is rotated in a controlled manner. In this case, the recording of the measured values from the Hall sensor elements can be triggered, for example, by controlling the electric motor or by an external sensor which determines the position of the shaft 310 and triggers the determination of a measured value by the Hall sensors (the further sensor elements) upon reaching an angle increment.

A further possible way of obtaining such measured values is to use the angles determined using the magnetoresistive sensors during operation to trigger the determination of a measured value by the further sensor elements upon reaching each angle increment. In these example implementations, the control device 500 can therefore be designed to trigger the determination of a measured value using the further sensor element when the first angle satisfies a predetermined criterion, that is to say, for example, when it reaches a further angle increment.

A further possible way of obtaining equidistant measured values involves interpolating temporally successive measured values from the Hall sensors, with the result that, although these values can be recorded in an equidistant manner in terms of time, measured values which correspond to constant angle increments are available as an input variable for the Fourier transform after interpolation. According to such example implementations, the control device can therefore be designed to interpolate temporally successive measured values from the further sensor element.

Measured values from Hall sensor elements may be comparatively noisy since the Hall sensor elements provide measured values having low amplitudes. In order to increase the accuracy with which the phase value is determined for the further sensor element, a plurality of measured values from the further sensor element can be combined according to some example implementations in order to obtain a phase value having a higher degree of accuracy. As one combination possibility, the measured values respectively recorded for an angle increment can be added in a weighted manner for a plurality of complete rotations, for example, or their mean value can be formed.

Alternatively, a phase value can be determined for each complete rotation and the individual phase values can be combined in order to obtain a phase value having an increased degree of accuracy. One possible way of combining the phase values again involves forming a mean value and another possibility involves using a low-pass filter. For example, the following low-pass filter could be used:

$$X_n(t) = 0.99 \cdot X_n(t-1) + 0.01 \cdot X_{ADC,n}(t).$$

It goes without saying that any other desired filters or combination possibilities can also be used for the individual phase values in order to reduce the statistical error.

Figures 6, 6A:
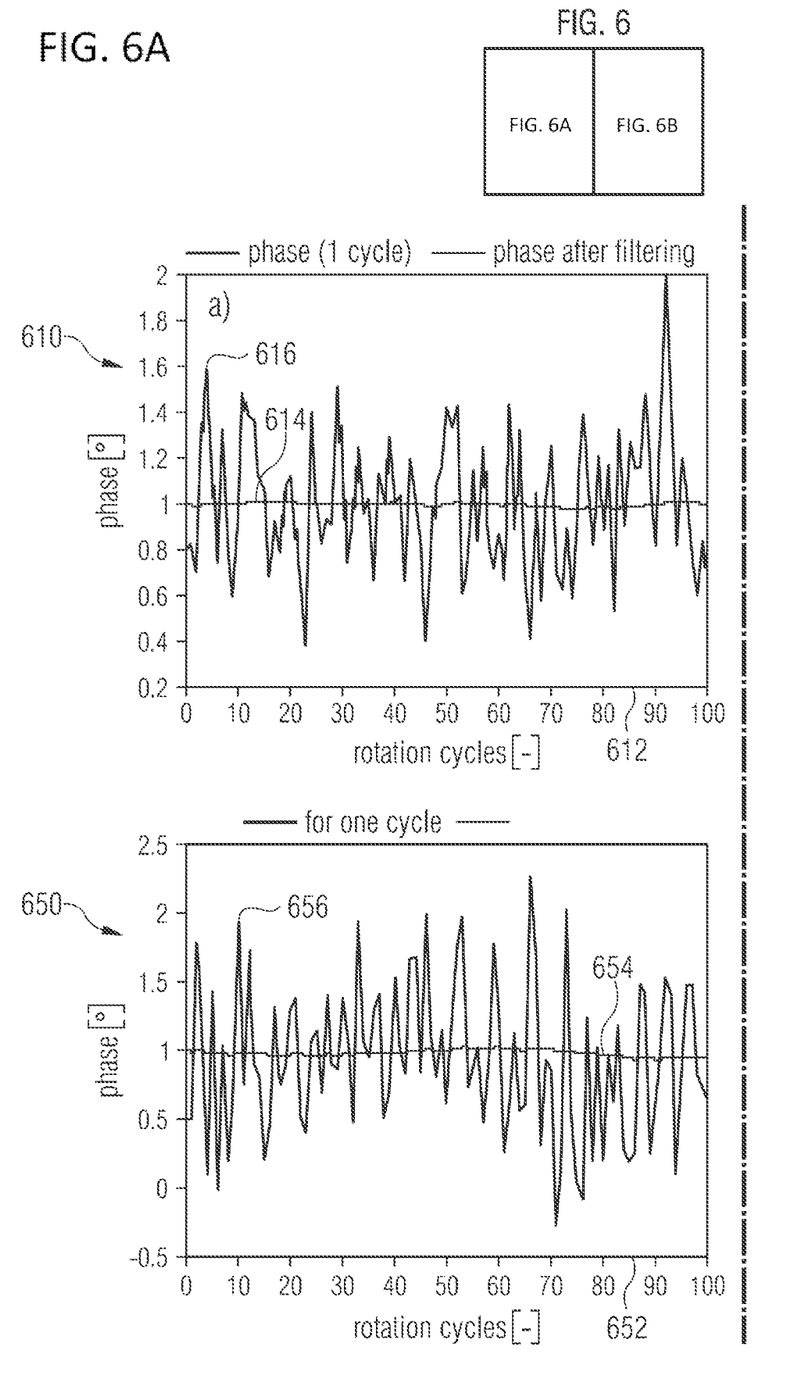

The result of filtering the phase values, which were each determined for successive complete rotations, using the above filter is illustrated in FIG. 6. The upper illustration 610 and the lower illustration 650 in FIG. 6A respectively show, on the x axis curves 612, 616, 652 and 656, the number of complete revolutions which were taken into account in order to determine the filtered phase values from the measured values from the Hall sensor elements.

In the case of the upper illustration 610 in FIG. 6A, 32 measured values were respectively recorded for each complete revolution and only eight measured values were recorded in the case of the lower illustration 650. The phase values which result for each individual rotation are illustrated in the form of the curves 616 and 656 in FIG. 6B, and the filtered phase values, that is to say those phase values which result from the combination of a plurality of measured or phase values, are illustrated by the curves corresponding to filtered phase values 614 and 654. The right-hand illustrations in FIG. 6B each show the residual phase error of the filtered phase values 614 and 654.

Figure 6B:
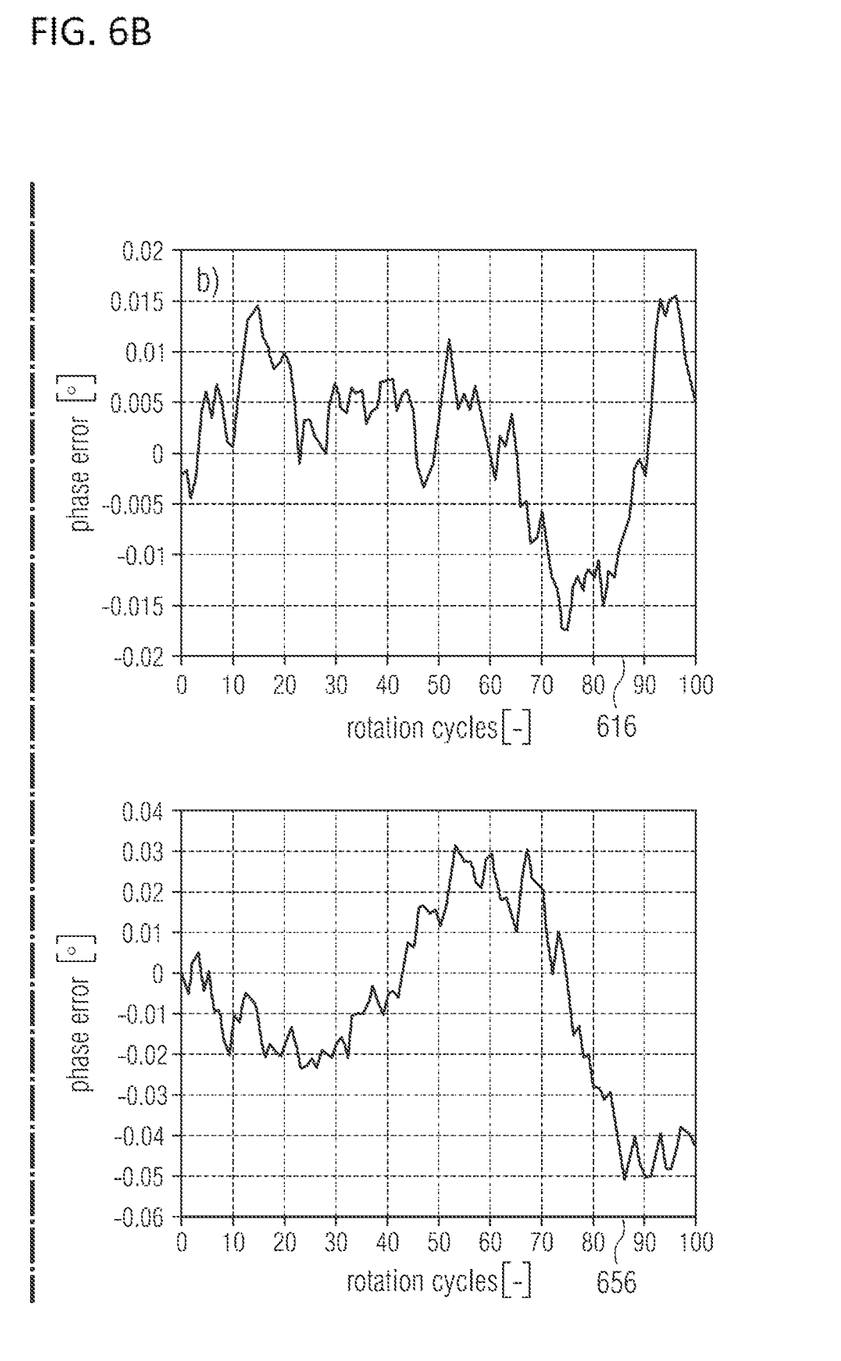

As is clear from the figures, a very high degree of accuracy with a residual error of less than 0.02° can be achieved in the case of the 32 measured values for each revolution and, even in the case of the only eight measured values for each complete revolution, the error remains less than 0.04°.

In further example implementations, the low-pass characteristic of the filter can be adapted, for example in order to achieve faster stabilization of the filtered phase.

According to further example implementations, a further possible way of correcting the first angle 480 involves first of all directly determining a second angle (A-VHALL) for each measured value from the Hall sensor elements and using this second angle to correct the first angle 480 (also designated A-XMR below).

Figure 7:
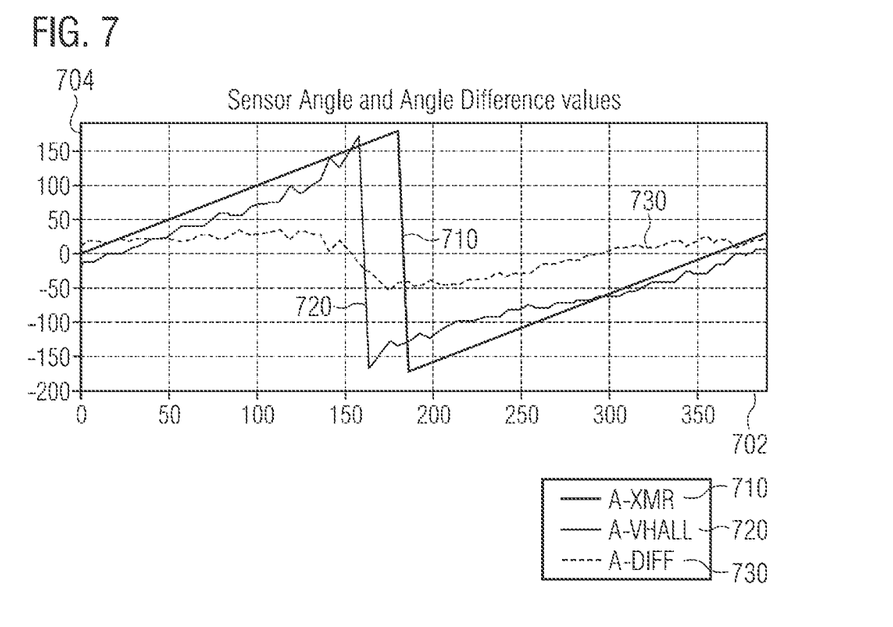
FIG. 7 shows an illustration of a possible way of correcting an angle determined using magnetoresistive sensor elements on the basis of the measured values from the further sensor element.

FIG. 7 illustrates this further possibility and shows the actual rotational angle of the shaft 310 on the X axis 702 and the angle values which were determined using the magnetoresistive sensor elements and the Hall sensor elements on the Y axis 704. A first curve 710 illustrates the angles from the measured values from the magnetoresistive sensor elements and a second curve 720 illustrates the angles from the measured values from the Hall sensor elements which have a high individual error on account of the noise of the measurement signals. A third curve 730 illustrates the difference between the angles from the magnetoresistive sensor elements 710 and the Hall sensor elements 720. Like the angles from the Hall sensor elements 730, the difference has an error. According to this example implementation, the control device 500 is therefore designed, in order to correct the first angle A-XMR, to first of all determine a second angle A-VHALL on the basis of the measured values from the further sensor element and to form a difference between first angles A-XMR and second angles A-VHALL determined at the same times.

According to some example implementations, the difference (curve 730) between the first angle A-XMR (curve 710) and the second angle A-VHALL (curve 720) for a plurality of successive measurements is combined. According to some example implementations, the combination can be carried out, for example, by forming the mean value or, in a similar manner to that discussed above, by using a low-pass filter with a suitable filter characteristic. In this case, the combination may relate to difference values of a single complete revolution or the difference values of a plurality of successive revolutions. With a sufficiently large and problem-oriented choice of the number of difference values between the first angle A-XMR and the second angle A-VHALL which are to be combined, the combined angle difference converges to form a value which represents the actual phase difference with a high degree of accuracy. According to this example implementation, the control device 500 is therefore designed, in order to correct the first angle A-XMR, to suitably combine a plurality of differences between the first angle A-XMR and the second angle A-VHALL which are determined for successive times.

Figure 8:
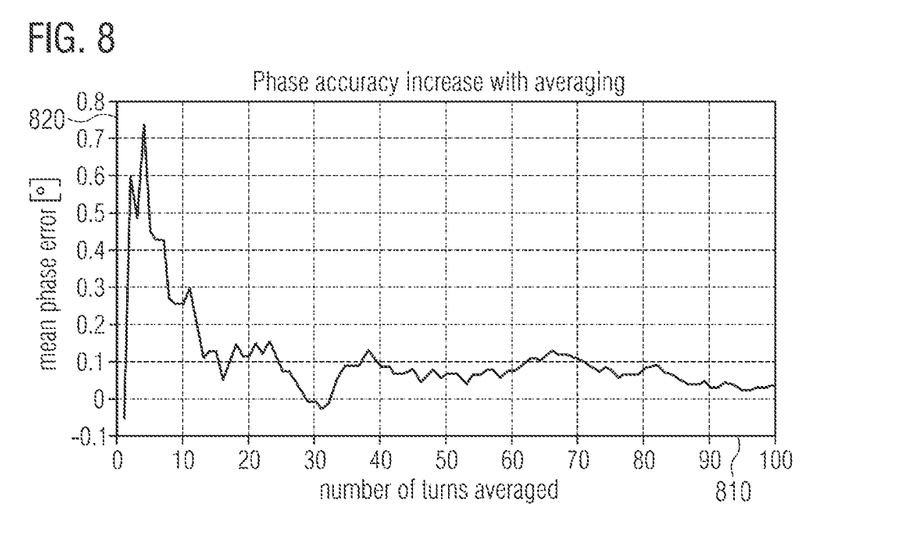
FIG. 8 shows an illustration of the accuracy which can be achieved when using the correction illustrated in FIG. 7.

The combined value for the angle difference, which is plotted in FIG. 8 for a multiplicity of successive complete revolutions, can then be used to correct each individual angle determination using the magnetoresistive sensors in order to correct their phase errors. FIG. 8 shows the number of successive complete revolutions on the X axis 810 and shows, on the Y axis 820, the mean value of the difference between the first angle A-XMR and the second angle A-VHALL which, with an increasing number of averaged differences (stated in complete revolutions), converges to form a constant value. In the specifically considered test arrangement on which FIGS. 7 and 8 are based, Hall sensor elements, which have a high amplitude error, the standard deviation of which is 10% of the amplitude, and for which 10% offset errors were also assumed, were assumed. Even for such high errors, the phase difference can be determined with a high degree of accuracy given a sufficiently high number of averaged angle differences, which, in the specific example, was able to be determined with a standard deviation of less than 0.1°, for example for 100 complete revolutions.

FIG. 9 again schematically shows a flowchart of an example implementation of a method 900 for determining a direction of a magnetic field.

Figure 9:
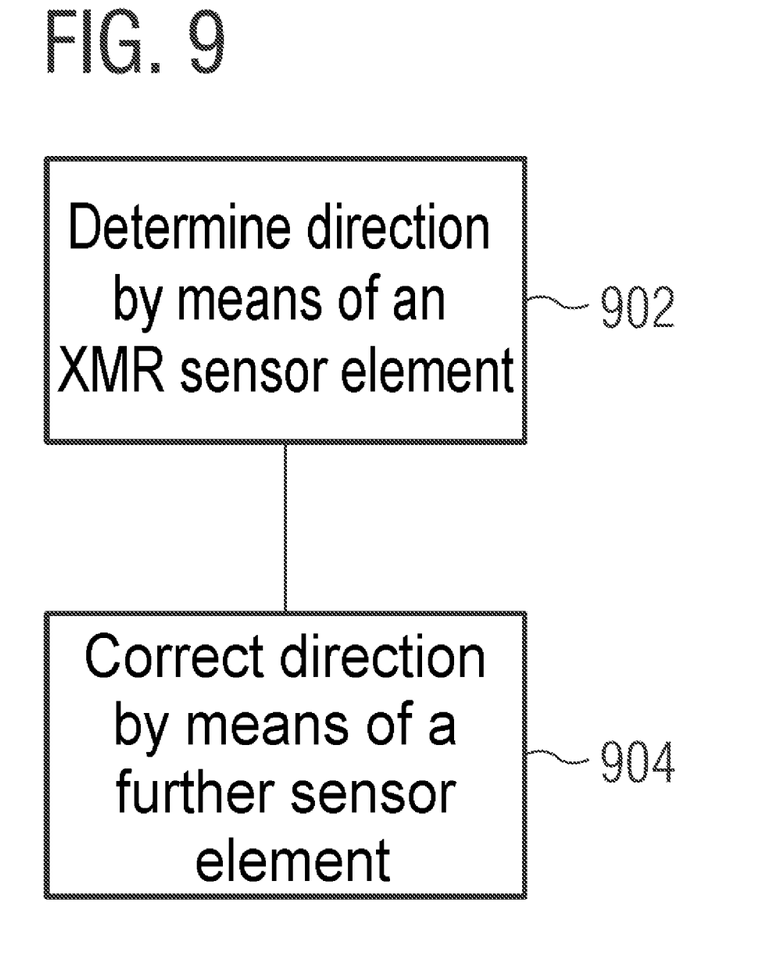
FIG. 9 schematically shows a flowchart of an example implementation of a method for determining a direction of a magnetic field.

The method comprises determining 910 a first angle indicating the direction of the magnetic field using at least one magnetoresistive sensor element. The method also comprises correcting the first angle 920 on the basis of measured values from a further sensor element of a different type which is suitable for determining the direction of the magnetic field.

Exemplary implementations of the method 900 can be carried out on any desired programmable hardware component irrespective of whether it is in a common chip or housing with the sensor. For example, the method can be carried out using dedicated circuits which are inside a substrate of the sensor. According to further example implementations, the method can also be carried out on a control device or an ECU (Electrical Control Unit), which are outside a housing of the sensor, for example in an ECU of a motor vehicle.

Even if it was assumed in the preceding example implementations that the magnetoresistive sensor elements and the further sensor elements are inside a chip or even on the same substrate, further example implementations of control devices and methods for determining a direction of a magnetic field may likewise use sensor elements which are arranged on different substrates or even in different chips provided that their relative arrangement with respect to one another is known or can be calibrated.

Even though a sensor which, in addition to magnetoresistive sensor elements, has at least one further sensor element of another type which can be used to measure a magnetic field was predominantly discussed in the preceding sections to the effect that it is possible to thereby calibrate a phase error in the angle measurement, such sensors can also be used in other advantageous ways. For example, the redundant information from the further sensor element can be additionally or alternatively used to check a method of operation of the magnetoresistive sensor elements in the sense of "functional safety". This check may generate an error signal, for example, if a severe deviation of the expected measurement result from the magnetoresistive sensor elements can be detected using the further sensor element. Further error states of a measurement arrangement, which cannot be detected using the magnetoresistive sensor elements, can also be detected using the measured values from the Hall sensor elements. The latter are operated in saturation, for example, with the result that changes in the strength of the magnetic field which may have different causes cannot be detected using the measured values from the magnetoresistive sensor elements. However, they can be detected using the measured values from the Hall sensor elements in order to infer, for example, that the magnet 320 is moving relative to the shaft 310, for example in the axial direction. This inevitably presupposes a disruption in the geometry and consequently a deterioration in the measurement result, to which the magnetoresistive sensor elements alone would not be sensitive, however.

The aspects and features which are described together with one or more of the examples and figures detailed above can also be combined with one or more of the further examples in order to replace an identical or similar feature of the further example or to additionally introduce the feature into the further example.

Examples may also be or relate to a computer program having a program code for carrying out one or more of the above methods if the computer program is executed on a computer or processor. Steps, operations or processes of different methods described above may be carried out by programmed computers or processors. Examples may also cover program storage apparatuses, for example digital data storage media, which are machine-readable, processor-readable or computer-readable and code machine-executable, processor-executable or computer-executable programs of instructions. The instructions carry out some or all of the steps of the methods described above or cause them to be carried out. The program storage apparatuses may comprise or be, for example, digital memories, magnetic storage media, for example magnetic disks and magnetic tapes, hard disk drives or optically readable digital data storage media. Further examples may also cover computers, processors or control units which are programmed to carry out the steps of the methods described above or (field) programmable logic arrays ((F)PLAs) or (field) programmable gate arrays ((F)PGAs) which are programmed to carry out the steps of the methods described above.

It goes without saying that the disclosure of a plurality of steps, processes, operations or functions disclosed in the description or in the claims shall not be interpreted as being in the particular order, unless explicitly or implicitly stated otherwise, for example for technical reasons. Therefore, these are not limited to a particular order by the disclosure of a plurality of steps or functions unless these steps or functions cannot be interchanged for technical reasons. Furthermore, in some examples, an individual step, function, process or operation may include a plurality of substeps, subfunctions, subprocesses or suboperations and/or may be broken up into these. Such substeps may be included and may be part of the disclosure of this individual step unless explicitly excluded.

The following claims are hereby included in the detailed description, where each claim can represent a separate example by itself. Whereas each claim can represent a separate example by itself, it should be noted that—although in the claims a dependent claim can refer to a particular combination with one or more other claims—other examples may also comprise a combination of the dependent claim with the subject matter of any other dependent or independent claim. Such combinations are hereby explicitly proposed provided that it is not stated that a particular combination is not intended. Furthermore, features of claim shall also be included for any other independent claim even if this claim is not made directly dependent on the independent claim.

The invention claimed is:

1. A sensor for determining a direction of a magnetic field, comprising:
    at least one magnetoresistive sensor element for determining the direction of the magnetic field; and
    at least one further sensor element of another type which is suitable for determining the direction of the magnetic field,
        wherein the at least one further sensor element is configured to determine a phase value which defines a rotational angle, associated with the magnetic field, with respect to a defined coordinate system, and
        wherein the rotational angle is used as a reference for correcting the direction of the magnetic field.

2. The sensor as claimed in claim 1, wherein the at least one magnetoresistive sensor element is arranged on a surface of a substrate; and
    wherein the at least one further sensor element is arranged inside the substrate.

3. The sensor as claimed in claim 2, wherein the at least one further sensor element extends inside the substrate perpendicular to the surface of the substrate.

4. The sensor as claimed in claim 1, wherein the at least one further sensor element is a Hall sensor element.

5. A control device for determining a direction of a magnetic field, which is configured to:
    determine a first angle indicating the direction of the magnetic field based on measured values from a magnetoresistive sensor element; and
    correct the first angle based on measured values from a further sensor element of a different type which is suitable for determining the direction of the magnetic field,
        wherein correcting the first angle comprises:
            determining, based on the measured values from the further sensor element, a phase value which defines a rotational angle, associated with the magnetic field, with respect to a defined coordinate system; and
            correcting, based on using the rotational angle as a reference, the direction of the first angle.

6. The control device as claimed in claim 5, further configured to correct the first angle, to carry out a Fourier transform of a plurality of measured values from the further sensor element to obtain the phase value for the further sensor element.

7. The control device as claimed in claim 5, further configured to interpolate temporally successive measured values from the further sensor element.

8. The control device as claimed in claim 5, wherein the control device is further configured to trigger the determination of a measured value using the further sensor element if the first angle satisfies a predetermined criterion.

9. The control device as claimed in claim 5, further configured to, in order to correct the first angle, determine a second angle based on the measured values from the further sensor element.

10. The control device as claimed in claim 9, further configured to determine the second angle, to combine a plurality of measured values from the further sensor element.

11. The control device as claimed in claim 9, further configured to correct the first angle, to form a difference between a first type of one or more angles, including the first angle, and a second type of one or more angles, including the second angle, determined at the same times.

12. The control device as claimed in claim 11, further configured to, in order to correct the first angle, combine a plurality of differences between the first angle and the second angle which are determined for successive times.

13. An angle sensor for determining a direction of a magnetic field, comprising:
the control device as claimed in claim 5 which is coupled to the magnetoresistive sensor element and to the further sensor element of a sensor.

14. The angle sensor as claimed in claim 13, further comprising:
a measurement signal output which is configured to output an output signal indicating a corrected first angle of the magnetic field.

15. A method for determining a direction of a magnetic field, comprising:
determining a first angle indicating the direction of the magnetic field using at least one magnetoresistive sensor element; and
correcting the first angle based on measured values from a further sensor element of a different type which is suitable for determining the direction of the magnetic field,
wherein correcting the first angle comprises:
determining, based on the measured values from the further sensor element, a phase value which defines a rotational angle, associated with the magnetic field, with respect to a defined coordinate system; and
correcting, based on using the rotational angle as a reference, the direction of the first angle.

16. The method as claimed in claim 15, further comprising:
carrying out a Fourier transform of a plurality of measured values from the further sensor element to obtain the phase value for the further sensor element.

17. The method as claimed in claim 15, further comprising:
interpolating temporally successive measured values from the further sensor element.

18. The method as claimed in claim 15, further comprising:
determining a second angle based on the measured values from the further sensor element to correct the first angle.

19. The method as claimed in claim 18, wherein the correction of the first angle further comprises forming a difference between a first type of one or more angles, including the first angle, and a second type of one or more angles, including the second angle, determined at the same times.

20. A computer program having a program code which causes a method as claimed in claim 15 to be carried out when the program code is executed on a programmable hardware component.

* * * * *